United States Patent [19]
Tawfik et al.

[11] Patent Number: 4,908,579
[45] Date of Patent: Mar. 13, 1990

[54] SWITCHED CAPACITOR SAMPLING FILTER

[75] Inventors: Mohamed S. Tawfik; Patrice Senn, both of Grenoble, France

[73] Assignee: Etat Francais, represente par le Ministre Delegue des Postes et Telecommunications, (Centre National d'Etudes des Telecommunications), Issy Les Moulineaux, France

[21] Appl. No.: 235,495

[22] Filed: Aug. 24, 1988

[30] Foreign Application Priority Data

Aug. 26, 1987 [FR] France .................... 8711961

[51] Int. Cl.⁴ .................... H03K 5/00; H03B 1/00
[52] U.S. Cl. .................... 328/167; 307/520; 330/9; 330/107; 333/173; 328/151
[58] Field of Search ............ 307/520, 521; 328/167, 328/151; 330/107, 109, 9; 333/173

[56] References Cited

U.S. PATENT DOCUMENTS 4,405,899 1/1984 Wurzburg .................... 330/107

FOREIGN PATENT DOCUMENTS 2068671 8/1981 United Kingdom ............ 333/173

OTHER PUBLICATIONS

Gregorian et al., "S.C. High-Pass Filter", IEEE Conference CSC, Pacific Grove, Calif., 11/78, pp. 669–673.
Gregorian, "S.C. Filter Design Using Cascaded Sctions", IEEE Trans. CAS, vol. CAS-27, No. 6, 6/80, pp. 515–521.
Gregorian et al., "MOS Sampled Data Hi-Pass Filters Using SC Integrators", Microelectronics Journal, vol. 11, No. 2, 3/80, pp. 22–25.
Electronics Letters, vol. 21, No. 2, Jan. 1985, pp. 79–80, Stevengage, Herts, Great Britain; H. Baher: "Synthesis of Highpass Switched-Capacitor LDI Filterss".
Electronics Letters, vol. 21, No. 11, May 23, 1985, pp. 484–485, Stevenage, Herts, Great Britain; S. Eriksson: "SC Filter Circuit with Decimation of Sampling Frequency".
Frequenz, vol. 35, No. 3/4, Mar.–Apr. 1981, pp. 93–95, Berlin, Federal Republic of Germany; P. Lutz: "Real Terminations of SC-Filters Using LDI-Integrators".
SC Modified Lossless Discrete Differentiators and Resulting SC Highpass Ladder Filters, Electronic Letters, Jan. 16, 1986, pp. 97–99.

Primary Examiner—Stanley D. Miller
Assistant Examiner—Timothy P. Callahan
Attorney, Agent, or Firm—Foley & Lardner, Schwartz, Jeffrey, Schwaab, Mack, Blumenthal & Evans

[57] ABSTRACT

This filter circuit comprises at least one basic cell (2) arranged as a switched capacitor sampling filter, together with a clock suitable for defining two different states for controlling sampling. According to the main characteristic of the invention, the circuit includes upstream switching means (4) suitable for inverting the polarity of the signal input to the cell during one of the two states, and downstream switching means (6) suitable for inverting the output signal from the cell (2). This makes it possible to transpose the filtering frequency band of the cell (2). The circuit is applicable to manufacturing switched capacitor sampling filters in the form of integrated circuits.

9 Claims, 6 Drawing Sheets

HIGHPASS FILTER

SWITCHED CAPACITOR SAMPLING FILTER

The present invention relates to a switched capacitor sampling filter. More particularly, it relates to a switched capacitor sampling filter of the highpass type. It is applicable in telecommunications to providing switched capacitor sampling filters in the form of integrated circuits.

BACKGROUND OF THE INVENTION

In general, switched capacitor sampling filters are made using a so-called "ladder" structure whose basic elements are lossless discrete integrators (LDIs) for lowpass filters or lossless discrete differentiators (LDDs) for highpass filters.

These basic elements comprise capacitors, switches, and a single amplifier. The order of the sampling filter is equal to the number of amplifiers, i.e. it is equal to the number of lossless discrete integrators or differentiators. A switched capacitor sampling filter using LDIs has the advantage of being insensitive to stray capacitance and of being better adapted to integrated circuits than a filter using LDDs. Unfortunately, a filter using LDIs is not satisfactorily in the frequency band of highpass filters since it suffers from problems of instability due to the use of a signal flowgraph for calculating the values of the capacitor elements in the filter, which approach does not take account of termination effects specific to highpass filters. In other words, the flowgraph of LDIs is well adapted to designing lowpass filters but does not apply properly to designing highpass filters.

In order to solve this problem, the article "SC MODIFIED LOSSLESS DISCRETE DIFFERENTIATORS AND RESULTING SC HIGHPASS LADDER FILTERS", Electronic Letters, Jan. 16, 1986, pages 97-99, proposes a method using a modified lossless discrete differentiator (MLDD) in order to obtain a switched capacitor sampling filter of the highpass type. The basic cell is an LDD which is modified and organized as a highpass filter. The use of an LDD makes it possible to obtain a sampling filter which is very stable and insensitive since its flowgraph applies well to the filter frequency band of highpass filters. Never-the-less, the drawback of this type of circuit is that the so-called "z" linear transform of the cell used to pass from the continuous frequency domain to the sampled frequency domain includes a second order term, i.e., a third order sampled filter would require six operational amplifiers, for example.

Such a circuit is therefore not satisfactory since it includes too high a number of operators, thereby increasing its manufacturing cost. In addition, the performance of the filter is degraded since it includes a capacitance which is highly sensitive to stray capacitance since it is bipolar switched. Finally, the calculation of the values of the filter elements from a predetermined filter characteristic when synthesizing a filter to meet predetermined requirements is approximate since the calculation is applicable, when designing highpass filters, only at high sampling frequencies, and this requires the use of differential amplifiers having a high gain-passband product.

A method is known in digital filtering for inverting the polarity of the LDD-type z-transform of a basic cell in order to obtain a highpass type digital filter. This method makes use of LDI-type lowpass filter design and changes various signs in the basic digital filter circuit. These sign changes are easily performed, for example by changing the sign of an adder. Unfortunately, this method used in digital filtering is difficult to apply to sampled filtering since it gives rise to technological problems which are difficult to solve. In particular, heretofore, changing the sign of the z-transform of a sampling filter requires technologically complicated operations using numerous amplifiers, capacitors, and switches. This increases the cost of manufacturing such filters in the form of integrated circuits.

The object of the present invention is to provide a solution to these problems. To this end, the invention provides a circuit suitable for transposing the filter frequency band of a switched capacitor sampling filter, e.g. to transform a lowpass type switched capacitor sampling filter into a highpass type switched capacitor sampling filter.

SUMMARY OF THE INVENTION

The invention provides a circuit of the type comprising at least one basic cell arranged as a switched capacitor sampling filter together with a clock suitable for defining two different states for controlling the sampling, wherein the circuit further comprises:

upstream switching means suitable for inverting the polarity of the input signal to the cell during one of the two states; and downstream switching means suitable for inverting the output signal from the cell, thereby making it possible to transpose the filtering frequency band of the cell.

More particularly, the basic cell is arranged as a lowpass type sampling filter, with the circuit as a whole then constituting a highpass type sampling filter.

In one aspect, the basic cell comprises:

a first differential amplifier whose negative input is connected via a first capacitor to the output of said first amplifier which delivers the output signal from the cell and whose positive input is grounded;

a first switch connected to one of the plates of a second capacitor, said first switch being suitable, under the control of the clock, for establishing an electrical connection between said second capacitor and the negative input of the first amplifier or between said second capacitor and ground; and a second switch connected to the other plate of the second capacitor, said second switch being suitable, under the control of the clock, for establishing an electrical connection between said second capacitor and the positive terminal of the basic cell or between said second capacitor and the negative terminal of the cell which receives the input signal of the cell.

The upstream switching means may comprise:

a third switch connected to the positive terminal of the basic cell, said third switch being suitable, under the control of the clock, for establishing an electrical connection between said positive terminal and ground or between said positive terminal and the input signal; and a fourth switch connected to the negative terminal of the basic cell, said fourth switch being suitable, under the control of the clock, for establishing an electrical connection between said negative terminal and ground or between said negative terminal and the input signal.

The downstream switching means may comprise:

a second differential amplifier of the inverting type and suitable, under the control of the clock, for inverting the polarity of the output signal from the circuit as a whole during the other one of the two states;

a fifth switch connected to the output from the first operational amplifier of the cell, said fifth switch being suitable, under the control of the clock, for establishing an electrical connection between said output from the first differential amplifier and a first node or between said output from the first differential amplifier and the input to the second differential amplifier; and a sixth switch connected to the output of the circuit as a whole, said sixth switch being suitable, under the control of the clock, for establishing an electrical connection between said output from the circuit as a whole and the output of the second differential amplifier or between said output of the circuit as a whole and the first node.

The upstream and downstream switching means of the invention make it possible to transpose the filtering frequency band of switched capacitor sampling filters effectively and simply. These upstream and downstream switching means may themselves be constituted in the form of easily defineable and interchangeable modules. As a result the manufacture of sampling filters in the form of integrated circuits is made easier and cheaper.

In a preferred embodiment of the invention, the downstream switching means are arranged as a sample-and-hold stage comprising an eighth switch connected to the output from the basic cell via a seventh switch suitable for controllably establishing an electrical connection between the output from the cell and the eighth switch, said eighth switch being suitable, under the control of the clock, for establishing an electrical connection between said seventh switch and the negative input of a third differential amplifier or between said seventh switch and the positive input of said third differential amplifier, the output signal from the circuit as a whole being obtained from the output of the third differential amplifier.

In a variant of the invention, the basic cell is a double sampling cell.

In a preferred embodiment of the variant of the invention, the downstream switching means comprise:

a ninth switch connected to the output from the basic cell, said ninth switch being suitable, under the control of the clock, for establishing an electrical connection between said output from the cell and a second node or between said output from the cell and a third node;

a tenth switch connected to the positive input of a fourth differential amplifier, said tenth switch being suitable, under the control of the clock, for establishing an electrical connection between said positive input and ground or between said positive input and the second node;

a third capacitor connected between the third node and the negative input to the fourth operational amplifier, said third capacitor having an eleventh switch connected in parallel therewith and suitable, under the control of the clock, for establishing an electrical connection between the two plates of said third capacitor; and a fourth capacitor connected between the negative input of the fourth operational amplifier and the output from said fourth amplifier which delivers the output signal from the circuit as a whole, said fourth capacitor having a twelfth switch connected in parallel therewith and suitable, under the control of the clock, for establishing an electrical connection between the two plates of the fourth capacitor.

In another aspect of the variant of the invention, the upstream switching means are arranged as a sample-and-hold stage.

In the second variant of the invention, the downstream switching means may comprise:

a thirteenth switch connected to the output from the cell, said thirteenth switch being suitable, under the control of the clock, for establishing an electrical connection between said output from the cell and a fourth node;

a fourteenth switch connected to the fourth node, said fourteenth switch being suitable, under the control of the clock, for establishing an electrical connection between said fourth node and a fifth node or between said fourth node and a sixth node;

a fifteenth switch connected to the positive input of a fifth differential amplifier, said fifteenth switch being suitable, under the control of the clock, for establishing an electrical connection between said positive input and ground or between said positive input and the fifth node;

a fifth capacitor connected between the sixth node an the negative input to the fifth operational amplifier, said fifth capacitor having a sixteenth switch connected in parallel therewith and suitable, under the control of the clock, for establishing an electrical connection between the two plates of the fifth capacitor;

a sixth capacitor connected between the negative input of the fifth operational amplifier and the output from said fifth amplifier which delivers the output signal of the circuit as a whole, said sixth capacitor having a seventeenth switch connected in parallel therewith and suitable, under the control of the clock, for establishing an electrical connection between the two plates of the sixth capacitor;

a seventh capacitor having one plate connected to the sixth node and having its other plate connected to ground; and an eighth capacitor having one plate connected to the positive input of the fifth differential amplifier and whose other plate is connected to ground.

BRIEF DESCRIPTION OF THE DRAWINGS

Embodiments of the invention are described by way of example with reference to the accompanying drawings, in which.

The accompanying drawings include items which are definitive in nature. They may therefore be used not only to clarify the following description, but also to contribute to the definition of the invention, where appropriate.

MORE DETAILED DESCRIPTION

Figure 1:
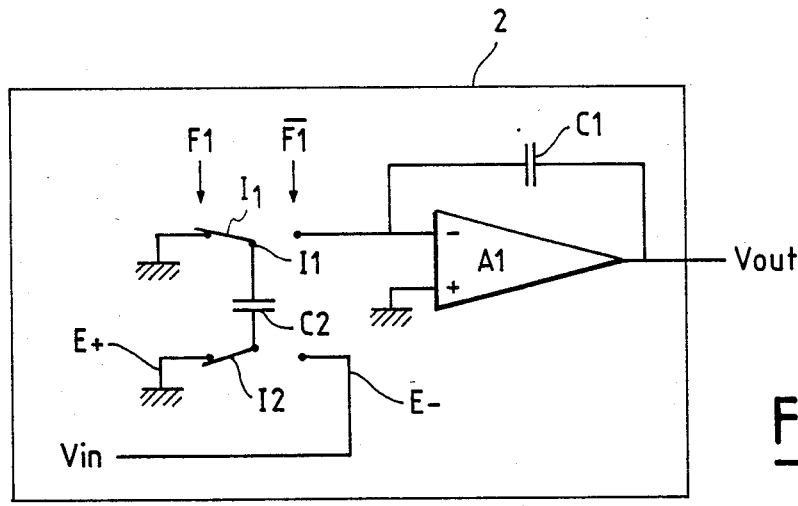
FIG. 1 is a diagram of a prior art basic cell arranged as a lowpass type switched capacitor sampling filter.

In FIG. 1, reference 2 designates a basic cell of a switched capacitor sampling filter circuit.

The basic cell 2 is constructed around a differential amplifier A1. The negative input to the differential amplifier A1 is connected via capacitor C1 to the output of the amplifier A1 which delivers an output signal $V_{out}$ from the basic cell 2. The positive input of the amplifier 1 is grounded.

A switch I1 is connected to one of the plates of a capacitor C2. A clock signal at frequency F1 has a high state during half-cycles written F1 and a low state during half-cycles written $\overline{F1}$ and controls the opening and closing of the switch I1. For example, during the low state $\overline{F1}$, the switch I1 establishes an electrical connection between the second capacitor C2 and the negative input of the differential amplifier A1, while during the high state F1 the switch I1 establishes an electrical connection between said second capacitor C2 and ground.

A switch I2 is connected to the other plate of the capacitor C2. The switch I2 is opened and closed under the control of the clock signal of frequency F1. For example, during the high state F1, the switch I2 establishes an electrical connection between the positive terminal E+ of the cell and the second capacitor C2, whereas during the low state $\overline{F1}$, the switch I2 establishes an electrical connection between the negative terminal E− of the basic cell 2 and said second capacitor C2. The input signal $V_{in}$ to the basic cell 2 is connected to the negative terminal E− of the basic cell 2.

Arranged in this way, the basic cell 2 behaves like a lowpass type switched capacitor sampling filter. The basic cell 2 is a lossless discrete integrator whose so-called z-transform for passing from the continuous frequency domain to the sampled frequency domain can be expressed as follows:

$$P \rightarrow 2F_e(z^{\frac{1}{2}} - z^{-\frac{1}{2}})$$

in which P is the continuous frequency domain and $F_e$ is the sampling frequency.

Figure 2:
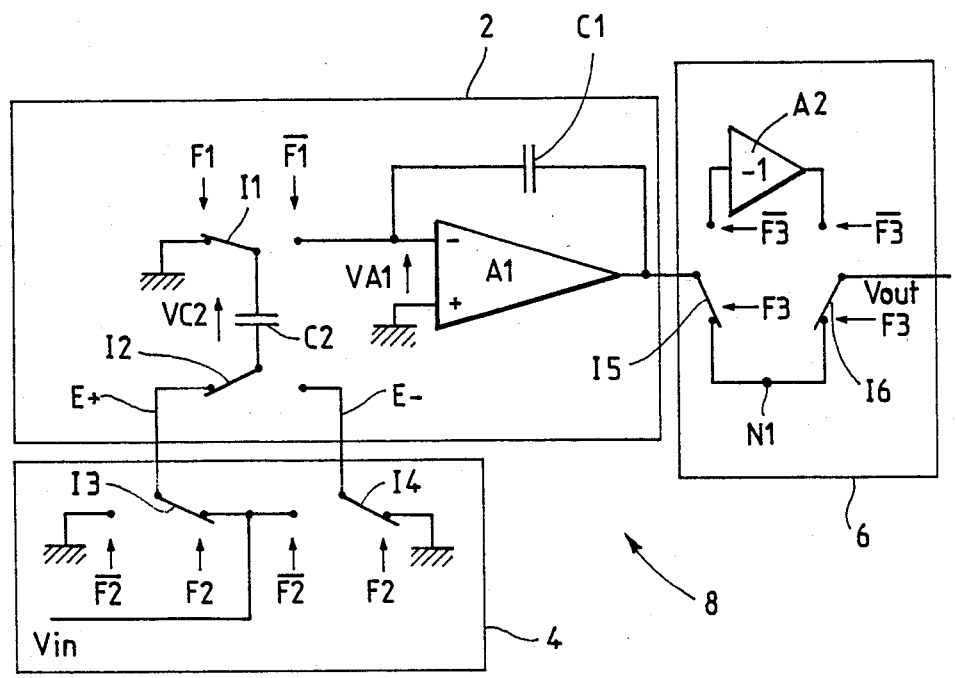
FIG. 2 is a diagram of the basic cell shown in FIG. 1 shown in conjunction with the upstream and downstream switching means of the invention.

FIG. 2 reproduces the basic cell 2 shown in FIG. 1, in conjunction with upstream and downstream switching means in accordance with the invention, respectively referenced 4 and 6.

The basic cell 2 is identical to that described with reference to FIG. 1.

The upstream switching means comprise a switch I3 connected to the positive terminal E+ of the basic cell, with the switch I3 being opened and closed under the control of a clock signal frequency F2 whose period is twice the period of the frequency F1 described with reference to FIG. 1. For example, during the low state $\overline{F2}$, the switch I3 establishes an electrical connection between the positive terminal E+ of the cell and ground, whereas during the high state F2, the switch I3 establishes an electrical connection between the positive terminal and the input signal to the cell, $V_{in}$.

The upstream switching means 4 finally include a switch I4 connected to the negative terminal E− of the basic cell 2. The switch I4 is opened and closed under the control of the clock signal of frequency F2. For example, during the low state $\overline{F2}$, the switch I4 establishes an electrical connection between the negative terminal E− of the basic cell 2 and the input signal to said cell, whereas during the high state F2, the switch I4 establishes an electrical connection between said negative terminal E− and ground.

The downstream switching means 6 include a switch I5 connected to the output from the differential amplifier A1 of the basic cell 2. The switch I5 is opened and closed under the control of a clock signal of frequency F3, having the same frequency as the signal F2, but offset therefrom by half a period. For example, during the high state F3, the switch I5 establishes an electrical connection between the output of the amplifier A1 and a node N1, whereas during the low state $\overline{F3}$, the switch I5 establishes an electrical connection between the output from the amplifier A1 and the input to an inverting type differential amplifier A2.

Finally, a switch I6 is connected to the output from the differential amplifier A2. The switch I6 is likewise opened and closed under the control of the clock signal of frequency F3. During the high state F3, the switch I6 establishes an electrical connection between the node N1 and the output $V_{out}$ of the circuit, whereas during the low state $\overline{F3}$, the switch I6 establishes an electrical connection between the output from the operational amplifier A2 and the output $V_{out}$ of the circuit. The circuit 8 comprising the basic cell 2 in conjunction with the means 4 and 6 thus constitutes a highpass type sampling filter whose z-transform for passing from the continuous frequency domain to the sampled frequency domain is expressed as follows:

$$P \rightarrow 2F_e(z^{\frac{1}{2}} + z^{-\frac{1}{2}})$$

in which P is the continuous frequency domain and $F_e$ is the sampling frequency.

The essential and novel characteristic of the circuit of the invention is to associate said basic cell 2 arranged as a lowpass filter including a lossless discrete integrator with upstream and downstream means serving to transpose the filter frequency band of the basic cell in order to obtain a highpass filter.

Figure 3:
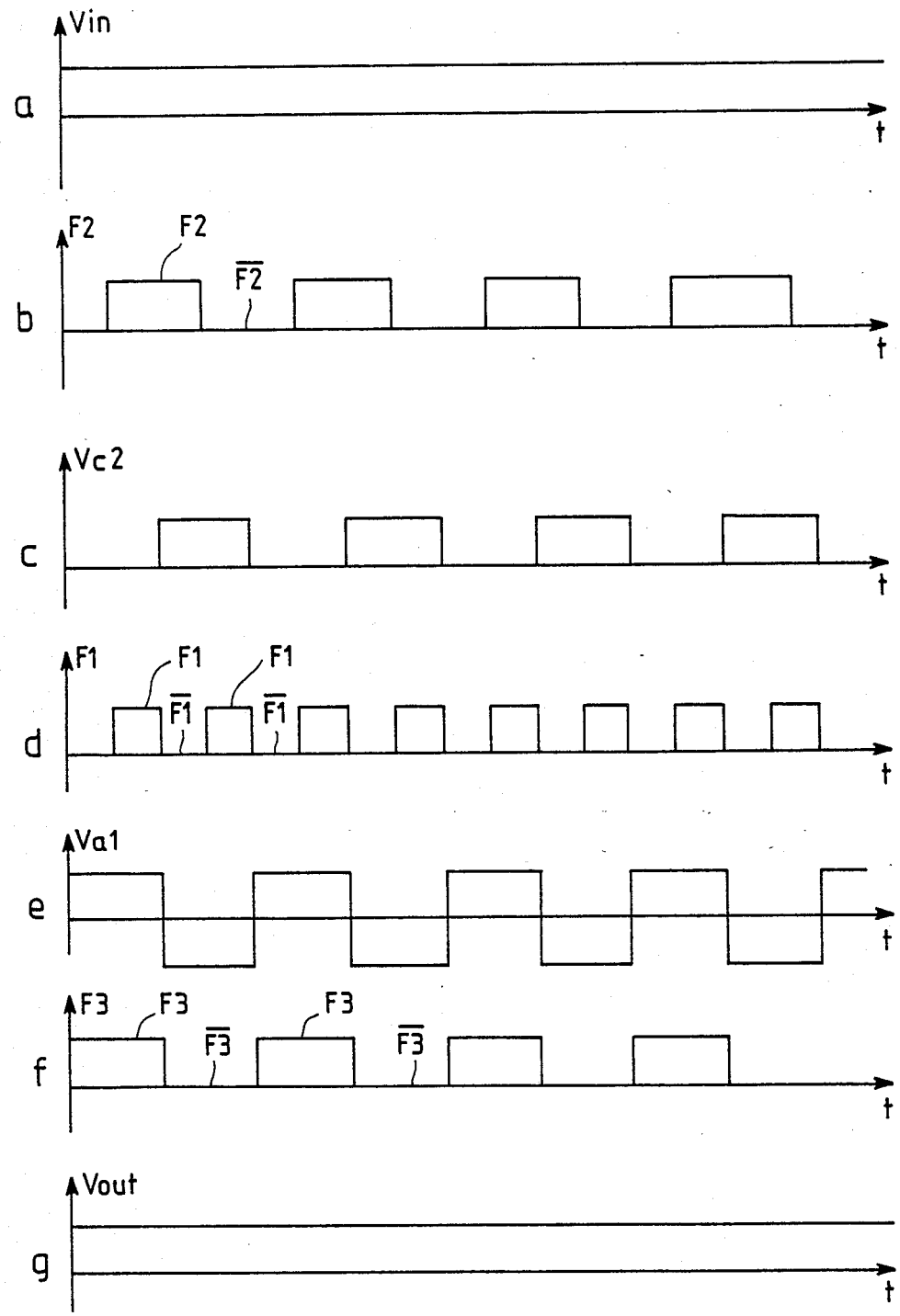
FIG. 3 is a timing diagram for explaining the operation of the circuit in accordance with the invention as shown in FIG. 2.

FIG. 3 shows timing diagrams illustrating the operation of the circuit described with reference to FIG. 2.

Portion (a) of FIG. 3 shows the input signal $V_{in}$ to the circuit as applied to the upstream switching means 4. The signal $V_{in}$ is a D.C. signal.

Portion (b) of FIG. 3 shows the clock signal of frequency F2 suitable for controlling the opening and closing of switches I3 and I4. Clock signal F2 periodically occupies a high state written F2 and a low state written $\overline{F2}$.

Portion (c) of FIG. 3 shows the voltage Vc2 across the terminals of the capacitor C2.

Portion (d) of FIG. 3 shows the clock signal at frequency F1 for controlling the opening and closing of switches I1 and I2. The clock signal F1 periodically occupies a high state written F1 and a low state written $\overline{F1}$. The clock signal F1 has a period which is one half the period of the clock signal F2.

Portion (e) of FIG. 3 shows the signal Va1 output by the differential amplifier A1.

Portion (f) of FIG. 3 shows the clock signal of frequency F3 suitable for controlling the opening and closing of the switches I5 and I6. The clock signal F3 periodically occupies a high state written F3 and a low state written $\overline{F3}$.

Finally, portion (g) of FIG. 3 shows the output signal $V_{out}$ from the circuit in accordance with the invention. The output signal is a D.C. signal.

During the first high state F2, switch I4 is grounded while switch I3 establishes an electrical connection between the signal $V_{in}$ and the input E+. The signal $V_{in}$ arrives at the input E+ and passes through the capacitor C2. During the first high state F1, switch I1 establishes an electrical connection between the capacitor C2 and ground. The input signal is thus connected via I3, E+, C2, and I1 to ground. As a result, the voltages Vc2 and Va1 are zero. During the first following low state $\overline{F1}$, switch I1 establishes an electrical connection between capacitor C2 and a negative input of amplifier A1. Capacitor C2 charges up to the input signal $V_{in}$ and the voltage Vc2 is thus equal to $V_{in}$. The voltage Va1 is likewise equal to the input signal $V_{in}$ but of opposite polarity since the capacitor C2 is connected to the negative input of the amplifier A1.

During the first low state $\overline{F2}$, switch I3 is grounded while switch I4 establishes an electrical connection between the input signal and the input E−, thereby causing the signal $V_{in}$ to arrive at input E− and pass through the capacitor C2. During the second high state F1, switch I2 does not establish an electrical connection between C2, E− and the signal $V_{in}$. The voltage across the terminals of capacitor C2 is maintained at the voltage of the signal $V_{in}$.

During the following second low state $\overline{F1}$, switch I2 establishes an electrical connection between the signal $V_{in}$ and the capacitor C2 and also establishes an electrical connection between the capacitor C2 and the negative input to the amplifier A1. As a result, the capacitor C2 discharges into the capacitor C1. The voltage across the terminals of the capacitor C2 is kept at zero, while the voltage at the output from the amplifier A1 is equal to the voltage of the input signal $V_{in}$.

During the first high state $\overline{F3}$, the switches I5 and I6 establish an electrical connection between the output of the amplifier A1 and the output of the circuit. The output signal of the circuit is thus equal to the output from the amplifier A1.

During the first low state $\overline{F3}$, the switches I5 and I6 establish an electrical connection between the output from the amplifier A1 and the input to the inverting amplifier A2. The output signal from the circuit is thus equal to the output signal from the amplifier A1 but of opposite polarity. The input and output signals of the circuit 8 are periodically reproduced under the clocking of the signals F1, F2, and F3 as described above.

Figure 4:
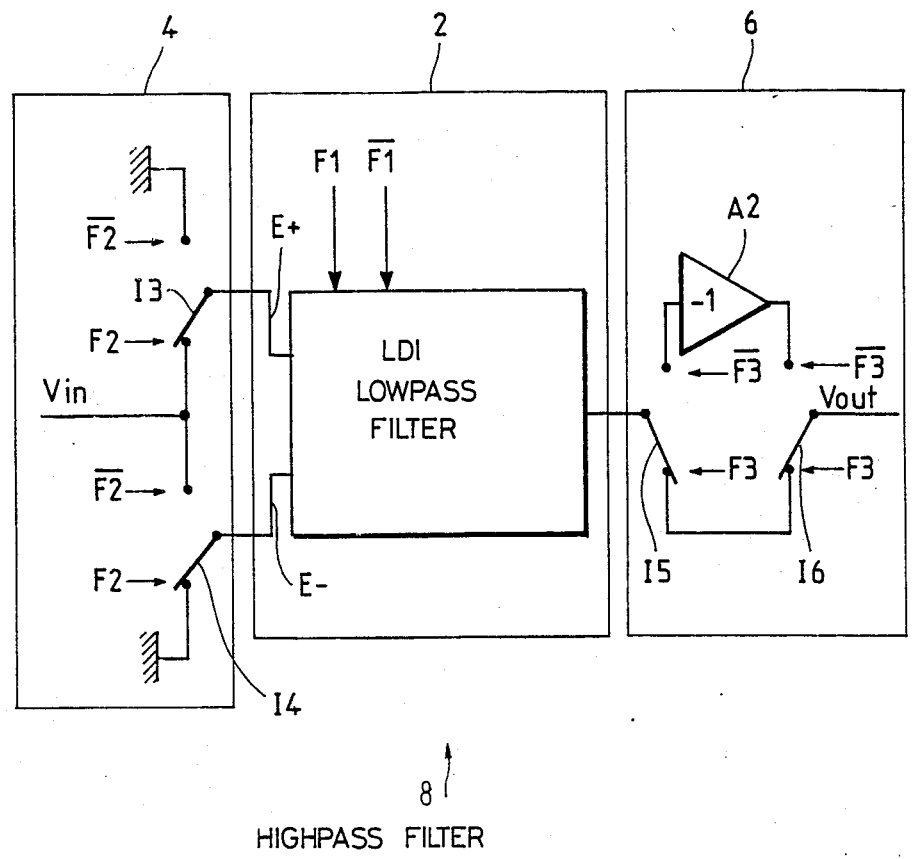
FIG. 4 is a block diagram of the circuit in accordance with the invention shown in FIG. 2.

FIG. 4 is a block diagram of the circuit 8 in accordance with the invention comprising a lossless discrete integrator type lowpass filter having upstream switching means 4 and downstream switching means 6 added thereto in order to obtain a highpass type switched capacitor sampling filter circuit.

The LDI lowpass filter referenced 2 is identical to the basic cell 2 described with reference to FIG. 1, and is controlled by the clock signal of frequency F1.

Upstream from the module 2, there are upstream switching means 4 which are identical to the upstream switching means 4 described with reference to FIG. 2, and downstream from the module 2 there are downstream switching means 6 which are identical with the downstream switching means 6 described likewise with reference to FIG. 2.

Figure 5:
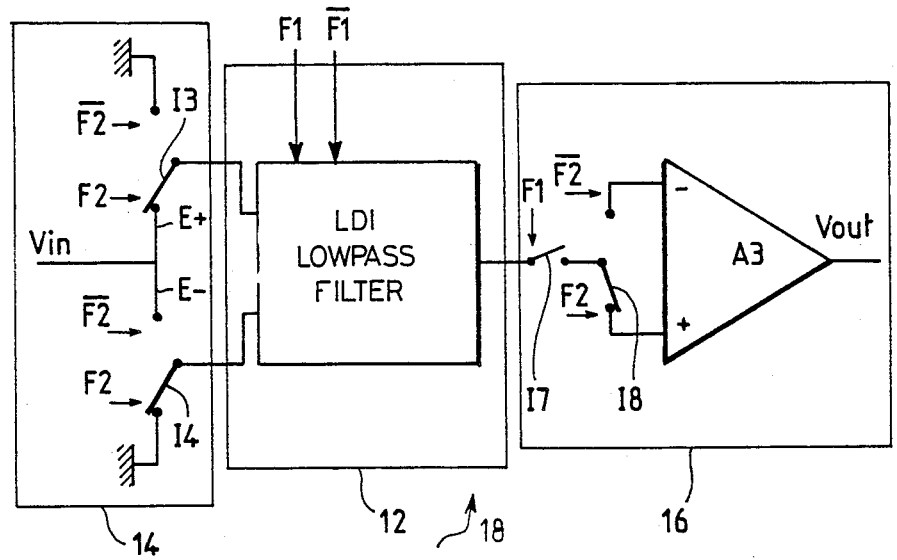
FIG. 5 shows an example of a circuit in accordance with the invention in which the downstream switching means include a sample-and-hold stage.

FIG. 5 shows a variant of the circuit in accordance with the invention.

In this variant, the downstream switching means 6 described with reference to FIG. 4 are replaced by downstream switching means 16 including a sample-and-hold stage 16.

The sample-and-hold stage 16 includes a switch I8 connected to the output from the basic cell 12 via another switch I7 which is opened and closed under the control of the clock signal of frequency F1.

The switch I8 is controlled by the clock signal of frequency F2. For example, during the high state F2, the switch I8 establishes an electrical connection between the positive input of operational amplifier A3 and the switch I7, while during the low state $\overline{F2}$, the switch I8 establishes an electrical connection between the negative input of the differential amplifier A3 and the switch I7.

The output from the differential amplifier A3 delivers the output signal $V_{out}$ from the circuit 18 which is arranged as a highpass type switched capacitor sampling filter. The upstream means 14 are identical to those described with reference to FIG. 4.

The sample-and-hold stage 16 samples the output signal from the lowpass filter 12 during the low state $\overline{F1}$ and holds them during the high state F1. During the high state F2, the non-inverting input to the operational amplifier A3 is active, whereas during the low state $\overline{F2}$, it is the inverting input to amplifier A3 which is active, and as a result the polarity of the output signal $V_{out}$ is inverted during $\overline{F2}$.

This variant of the circuit in accordance with the invention thus makes it possible to omit the clock signal of frequency F3 which was used for controlling the operational amplifier A2 in the downstream means 4 described with reference to FIGS. 2 and 4.

Figure 6:
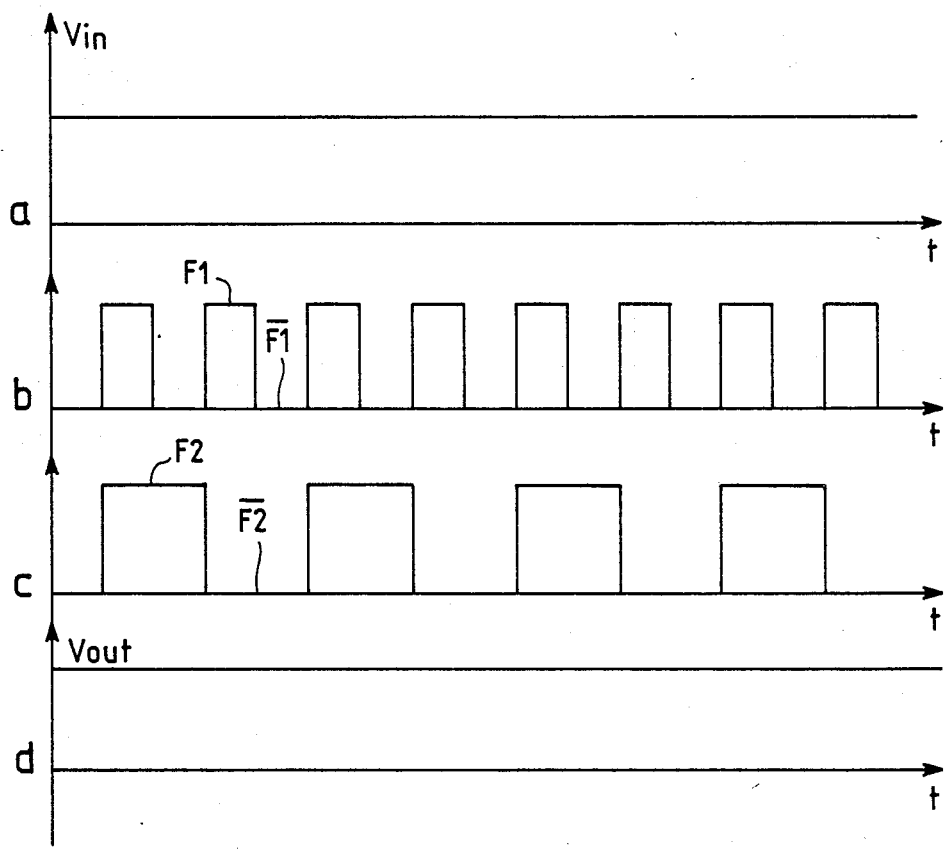
FIG. 6 is a timing diagram for explaining the operation of the circuit in accordance with the invention shown in FIG. 5.

FIG. 6 shows timing diagrams illustrating the operation of the highpass filter described with reference to FIG. 5. Portions (a), (b), (c), and (d) of FIG. 6 are respectively identical to portions (a), (b), (c), and (g) of FIG. 3 since, in the variant of the invention described with reference to FIG. 5, only the downstream switching means 16 differ from the downstream switching means 4 described with reference to FIGS. 2 and 4.

It can be seen in FIG. 6 that there is no longer a clock signal F3 since the downstream switching means 16 are now controlled by the clock signals F2 and F1 which invert the polarity of the output signal from the LDI lowpass filter 12 during the high state F2 as sampled during the low state $\overline{F1}$.

Figure 7:
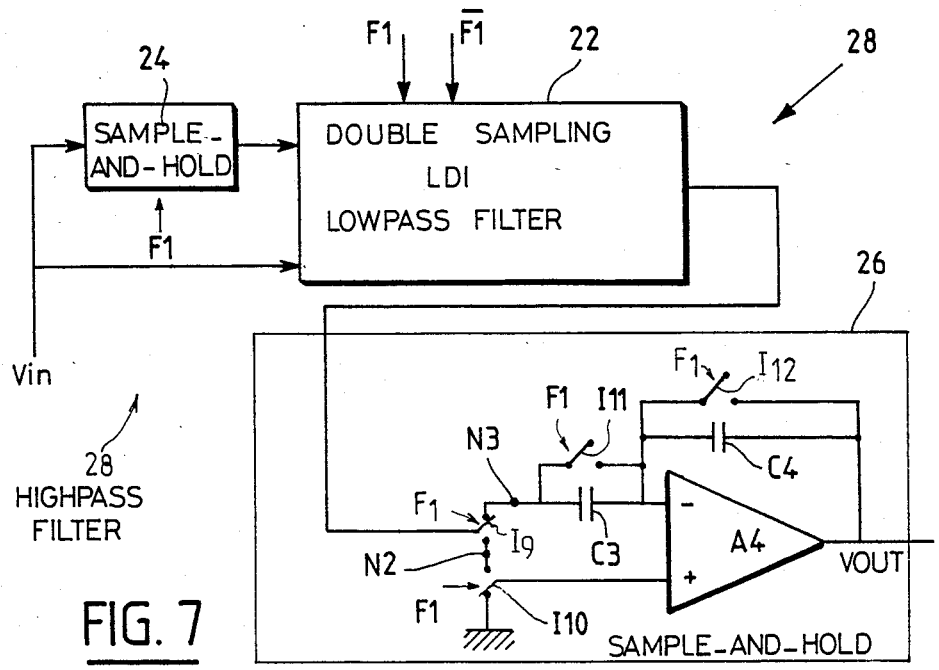
FIG. 7 is a block diagram of a variant circuit in accordance with the invention in which the basic cell includes double sampling in accordance with the invention.

FIG. 7 shows another variant of the circuit of the invention. In this variant, the basic cell 22 organized as a lowpass type switched capacitor sampling filter using the LDI transformation is now a filter providing double sampling.

The downstream means 26 are organized as a sample-and-hold stage as are the downstream switching means 16 described with reference to FIG. 5. The sample-and-hold stage 26 includes a switch I9 connected to the output signal from the basic cell 22. The switch I9 is opened and closed under the control of the clock signal of frequency F1.

During the low state $\overline{F1}$, the switch I9 establishes an electrical connection between said output of the basic cell 22 and a node N3, whereas during the high state F1, the switch I9 establishes an electrical connection between said output and a node N2.

A switch I10 is connected to the positive input of a differential amplifier A4. The switch I10 is opened and closed under the control of the clock signal of frequency F1. During the high state F1, the switch I10 establishes an electrical connection between said positive input and ground, whereas during the low state $\overline{F1}$, the switch I10 establishes an electrical connection between said positive input to the differential amplifier A4 and the second node N2. A capacitor C3 is placed between the node N3 and the negative input to the operational amplifier A4. The capacitor C3 has a parallel connected switch I11 suitable for establishing an electrical connection during the low state $\overline{F1}$ between the two plates of the capacitor C3.

The sample-and-hold stage 26 finally includes a capacitor C4 placed between the negative input of the operational amplifier A4 and the output from said operational amplifier A4 which delivers the output signal from the circuit 28. The capacitor C4 has a parallel connected switch I12 suitable for establishing an electrical connection between the two plates of the capacitor C4 during the low state $\overline{F1}$.

During each high state F1, the output signal from the lowpass filter 22 passes via the capacitor C3, the inverting input to the amplifier A4, and the capacitor C4. The output signal $V_{out}$ from the circuit 28 is thus proportional to the output signal of the lowpass filter 22 multiplied by a negative coefficient of proportionality equal to C3/C4.

During each low state $\overline{F1}$, the output signal from the lowpass signal 22 passes via the non-inverting input to the amplifier A4. The output signal $V_{out}$ from the circuit 28 is thus equal to the output signal from the lowpass filter 22.

The upstream switching means 24 are likewise arranged as a sample-and-hold stage. The stage 24 performs the same function as the above-described means 4 and 14 by sampling the input signal $V_{in}$ during the high state F1 and by holding the samples during the low state $\overline{F1}$.

Figure 8:
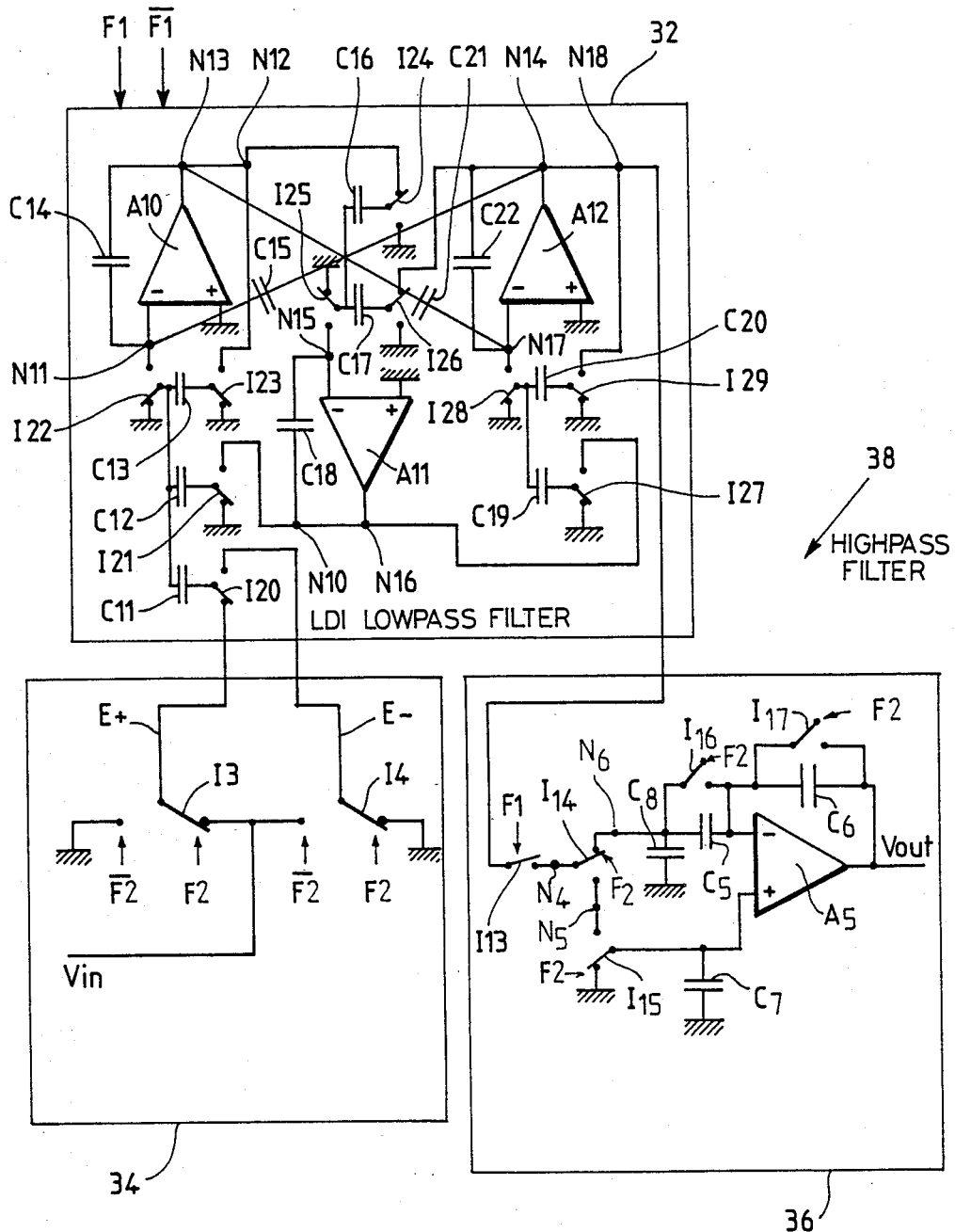
FIG. 8 is a block diagram of an elliptical highpass type switched capacitor sampling filter in accordance with the invention.

FIG. 8 shows a third order elliptical highpass type switched capacitor sampling filter circuit. The circuit 38 comprises a third order lowpass filter 32, i.e. a filter including three operational amplifiers to which upstream and downstream switching means 34 and 38 have been added.

The basic cell 32 is sampled at the frequency F1, without double sampling.

There are three capacitors C11, C12, and C13 at the input E+ to the basic cell. A switch I20 connected upstream from one of the plates of the capacitor C11 serves to establish an electrical connection between the input E+ of the cell 32 and said plate of the capacitor C11 or between said input E+ and the negative input E— of the cell 32, under the control of the clock signal F1.

A switch I21 connected upstream from one of the plates of the capacitor C12 establishes an electrical connection between said plate of the capacitor C12 and ground or between said plate of C12 and node N10 under the control of the clock signal F1. The other plate of the capacitor C12 is connected to one of the plates of the capacitor C13 which itself connected to a switch I22, with the other plate of capacitor C13 being connected to a switch I23.

Under the control of clock signal F1, switch I22 establishes an electrical connection between one of the plates of C13 and ground or between said plate of C13 and a node N11.

Under the control of clock signal F1, the switch I23 establishes an electrical connection between the other plate of C13 and ground or between the said plate of C13 and a node N12.

The node N11 is connected firstly to one of the plates of a capacitor C14 whose other plate is connected to a node N13, secondly to one of the plates of a capacitor C15, and finally to the negative input of a differential amplifier A10. The positive input of the differential amplifier A10 is grounded and the output of said amplifier A10 is connected to the node N13. The other plate of the capacitor C15 is connected to a node N14.

The node N12 is connected to a switch I24 under the control of the clock signal F1 and serving to establish an electrical connection between the node N12 and one of the plates of a capacitor C16 or between said plate of the capacitor C16 and ground. The other plate of the capacitor C16 is connected to a capacitor C17 having one of it plates connected to a switch I25 and having its other plate connected to a switch I26.

Under the control of clock signal F1, the switch I25 establishes an electrical connection between one of the plates of C17 and a node N15, or between said plate of C17 and ground.

Under the control of clock signal F1, the switch I26 establishes an electrical connection between the other plate of C17 and the node N14 or between said other plate of C17 and ground.

The node N15 is connected firstly to the node N10 via a capacitor C18 and secondly to the negative input of a differential amplifier A11 whose positive input is connected to ground. The output from the operational amplifier A11 is connected to a node N16 which is connected to the node N10 and to a switch I27.

Under the control of the clock signal F1, the switch I27 establishes an electrical connection between the node N16 and one of the plates of a capacitor C19, or between said plate of C19 and ground.

The other plate of capacitor C19 is connected to one of the plates of a capacitor C20 which is itself connected to a switch I28, with the other plate of capacitor C20 being connected to a switch I29.

Under the control of clock signal F1, switch I28 establishes an electrical connection between one of the plates of the capacitor C20 and a node N17, or between said plate of C20 and ground.

Under the control signal F1, switch I29 establishes an electrical connection between the other plate of capacitor C20 and a node N18 or between said plate of the capacitor C20 and ground.

The node N17 is connected firstly to the node N13 via a capacitor C21, secondly to the node N14 via a capacitor C22, and finally to the negative input of a differential amplifier A12 whose positive input is connected to ground. The output from the differential amplifier A12 is connected to the node N14.

The upstream switching means 34 are identical to the means 4 described with reference to FIGS. 2 and 4.

The downstream switching means 36 are very similar in structure to the downstream switching means described with reference to FIG. 7. Thus, switches I14, I15, I16, and I17 accompanied by nodes N5 and N6 are identical to switches I9, I10, I11, and I12 respectively accompanied by nodes N3 and N4 as described with reference to FIG. 7. Similarly, capacitors C5 and C6 are identical to capacitors C3 and C4, respectively. Finally, operational amplifier A5 is identical to amplifier A4. However, since the circuit of the invention is a single sampling filter, the downstream means 36 include additional capacitors C7 and C8 which maintain the voltages at their terminals during the non-sampling periods of the filter.

The capacitor C7 has one plate connected to the sixth node N6 and its other plate connected to ground. The capacitor C8 has one plate connected to the positive input of the differential amplifier A5 and its other plate connected to ground.

The switches I14, I15, I16, and I17 are opened and closed under the control of the clock signal of frequency F2, whereas the switch I13 which connects the switch I14 to the output of the basic cell 32 via the node N4 is opened and closed under the control of the clock signal F1.

Whenever F1 and F2 are in the high state, the output signal from the lowpass filter 32 passes via the capacitor C5, the inverting terminal of A5, and the capacitor C6. The output signal $V_{out}$ from the circuit 38 is thus proportional to the output signal from the lowpass filter 32 multiplied by a negative coefficient equal to C5/C6.

Whenever F1 is in the high state and $\overline{F2}$ is in the low state, the output signal from the lowpass filter 22 passes via the non-inverting terminal of A5. The output signal $V_{out}$ from the circuit 38 is thus equal to the output signal from the lowpass filter 32.

What is claimed is:

1. A circuit of the type comprising at least one basic cell arranged as a switched capacitor low pass sampling filter, together with a clock suitable for defining two different states for controlling sampling, wherein the circuit further comprises:
   upstream switching means suitable for inverting the polarity of an input signal to the cell during one of the two states; and
   downstream switching means suitable for inverting an output signal from the cell, thereby making it possible to transpose the filtering frequency band of the cell from low-pass to high pass.

2. A circuit according to claim 1 wherein the basic cell comprises:
   a first differential amplifier whose negative input is connected via a first capacitor to the output of said first amplifier which delivers the output signal from the cell and whose positive input is grounded;
   a first switch connected to one of the plates of a second capacitor, said first switch being suitable, under the control of the clock for establishing an electrical connection between said second capacitor and the negative input of the first amplifier or between said second capacitor and ground; and
   a second switch connected to the other plate of the second capacitor, said second switch being suitable, under the control of the clock, for establishing an electrical connection between said second capacitor and a positive terminal of the basic cell or between said second capacitor and a negative terminal of the cell which receives the input signal of the cell.

3. A circuit according to claim 1, wherein the upstream switching means comprise:
   a third switch connected to a positive terminal of the basic cell, said third switch being suitable, under the control of the clock, for establishing an electrical connection between said positive terminal and ground or between said positive terminal and the input signal; and
   a fourth switch connected to a negative terminal of the basic cell, said fourth switch being suitable, under the control of the clock, for establishing an electrical connection between said negative terminal and ground or between said negative terminal and the input signal.

4. A device according to claim 1, wherein the downstream switching means comprise:
   a second differential amplifier of the inverting type and suitable, under the control of the clock, for inverting the polarity of the output signal from the circuit as a whole during the other one of the two states;
   a fifth switch connected to the output from a first differential amplifier of the cell, said fifth switch being suitable, under the control of the clock, for establishing an electrical connection between the output from the first differential amplifier and a first node or between said output from the first differential amplifier and the input to the second differential amplifier; and
   a sixth switch connected to the output of the circuit as a whole, said sixth switch being suitable, under the control of the clock, for establishing an electrical connection between said output from the circuit as a whole and the output of the second differential amplifier or between said output of the circuit as a whole and the first node.

5. A circuit according to claim 1, wherein the downstream switching means are arranged as a sample-and-hold stage, the stage comprising an eighth switch connected to the output from the basic cell via a seventh switch suitable for controllably establishing an electrical connection between the output from the cell and the eighth switch, said eighth switch being suitable, under the control of the clock, for establishing an electrical connection between said seventh switch and the negative input of a third differential amplifier or between said seventh switch and the positive input of said third differential amplifier, the output signal from the circuit as a whole being obtained from the output of the third differential amplifier.

6. A circuit according to claim 1, wherein the basic cell is a double sampling cell.

7. A circuit according to claim 6, wherein the upstream switching means are arranged as a sample-and-hold stage.

8. A circuit according to claim 1, wherein the downstream switching means comprise:
   a ninth switch connected to the output from the basic cell, said ninth switch being suitable, under the control of the clock, for establishing an electrical connection between said output from the cell and a second node or between said output from the cell and a third node;
   a tenth switch connected to the positive input of a fourth differential amplifier, said tenth switch being suitable, under the control of the clock, for establishing an electrical connection between said positive input and ground or between said positive input and the second node;
   a third capacitor connected between the third node and the negative input to the fourth operational amplifier, said third capacitor having an eleventh switch connected in parallel therewith and suitable, under the control of the clock, for establishing an electrical connection between the two plates of said third capacitor; and a fourth capacitor connected between the negative input of the fourth operational amplifier and the output from said fourth amplifier which delivers the output signal from the circuit as a whole, said fourth capacitor having a twelfth switch connected in parallel therewith and suitable, under the control of the clock, for establishing an electrical connection between the two plates of the fourth capacitor.

9. A circuit according to claim 1, wherein the downstream switching means comprise:

a thirteenth switch connected to the output from the cell, said thirteenth switch being suitable, under the control of the clock, for establishing an electrical connection between said output from the cell and a fourth node;

a fourteenth switch connected to the fourth node, said fourteenth switch being suitable, under the control of the clock, for establishing an electrical connection between said fourth node and a fifth node or between said fourth node and a sixth node;

a fifteenth switch connected to the positive input of a fifth differential amplifier, said fifteenth switch being suitable, under the control of the clock, for establishing an electrical connection between said positive input and ground or between said positive input and the fifth node;

a fifth capacitor connected between the sixth node an the negative input to the fifth operational amplifier, said fifth capacitor having a sixteenth switch connected in parallel therewith and suitable, under the control of the clock, for establishing an electrical connection between the two plates of the fifth capacitor;

a sixth capacitor connected between the negative input of the fifth operational amplifier and the output from said fifth amplifier which delivers the output signal of the circuit as a whole, said sixth capacitor having a seventeenth switch connected in parallel therewith and suitable, under the control of the clock, for establishing an electrical connection between the two plates of the sixth capacitor;

a seventh capacitor having one plate connected to the sixth node and having its other plate connected to ground; and an eighth capacitor having one plate connected to the positive input of the fifth differential amplifier and whose other plate is connected to ground.

* * * * *